(12) United States Patent
Diener et al.

(10) Patent No.: US 8,904,262 B2
(45) Date of Patent: *Dec. 2, 2014

(54) PROVIDING CAPACITY OPTIMIZED STREAMING DATA WITH FORWARD ERROR CORRECTION

(71) Applicant: Cisco Technology, Inc., San Jose, CA (US)

(72) Inventors: Neil Diener, Hudson, OH (US); John Matthew Swartz, Lithia, FL (US); William Robert Seed, Los Altos, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/962,145

(22) Filed: Aug. 8, 2013

(65) Prior Publication Data

US 2013/0326303 A1 Dec. 5, 2013

Related U.S. Application Data

(63) Continuation of application No. 13/016,117, filed on Jan. 28, 2011, now Pat. No. 8,539,319.

(51) Int. Cl.
*H03M 13/00* (2006.01)
*H03M 13/05* (2006.01)
*H04L 1/00* (2006.01)

(52) U.S. Cl.
CPC ............ *H03M 13/05* (2013.01); *H04L 1/0041* (2013.01); *H04L 1/0019* (2013.01); *H04L 1/0017* (2013.01)
USPC .......................................................... 714/776

(58) Field of Classification Search
CPC ..... H03M 13/05; H04L 1/0017; H04L 1/0019
USPC ................................................. 714/746, 776
See application file for complete search history.

(56) References Cited

U.S. PATENT DOCUMENTS

| | | | |
|---|---|---|---|
| 7,447,235 B2 * | 11/2008 | Luby et al. ............... | 370/476 |
| 2008/0253369 A1 * | 10/2008 | Oran et al. ............... | 370/390 |
| 2009/0327842 A1 * | 12/2009 | Liu et al. ............... | 714/776 |

* cited by examiner

*Primary Examiner* — Shelly A Chase
(74) *Attorney, Agent, or Firm* — Tucker Ellis LLP

(57) ABSTRACT

In an example embodiment, there is described herein a methodology were the Forward Error Correction (FEC) data for a data stream is distributed into a plurality of FEC sub-streams. Subscribers to the data stream indicate which of the plurality of FEC sub-streams should be provided to them. The distribution of FEC sub-streams are limited to subscribed FEC sub-streams. FEC sub-streams with no subscribers are not forwarded beyond a distribution point such as an access point (AP).

20 Claims, 4 Drawing Sheets

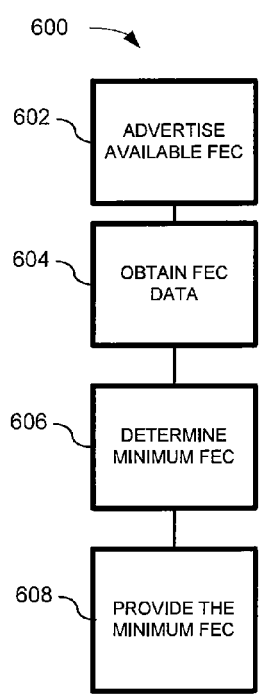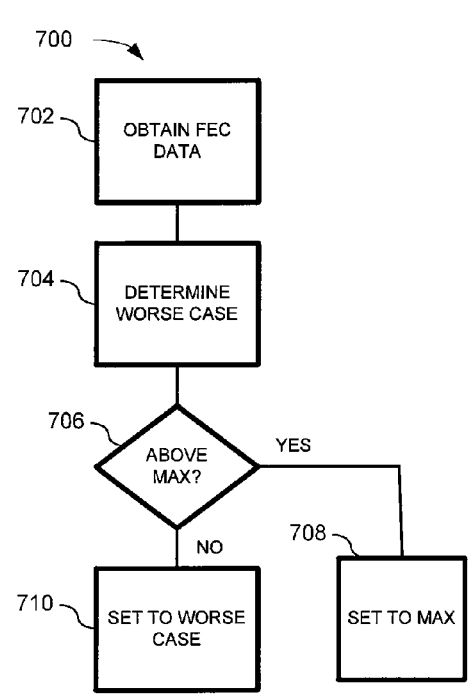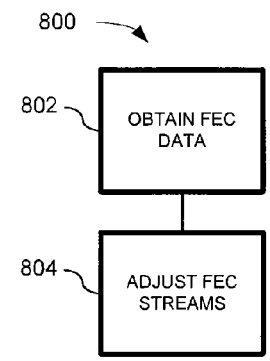
FIG. 6    FIG. 7    FIG. 8

PROVIDING CAPACITY OPTIMIZED STREAMING DATA WITH FORWARD ERROR CORRECTION

CROSS REFERENCE TO RELATED APPLICATIONS

This application is a continuation of U.S. patent application Ser. No. 13/016,117, filed Jan. 28, 2011.

TECHNICAL FIELD

The present disclosure relates generally to providing streaming data such as multicast video data.

BACKGROUND

In sports and entertainment venues such as stadiums and concert halls, there is a growing market to distribute event-specific streaming video content (such as replays, alternate camera angles, alternate games, etc) to screens within the venue. It may also be desirable to provide streaming video content to mobile devices within the venue, so fans can view the video content while they are in their seats, at the food concourse, etc.

BRIEF DESCRIPTION OF THE DRAWINGS

The accompanying drawings incorporated herein and forming a part of the specification illustrate the example embodiments.

FIG. 6 is a block diagram illustrating an example of a methodology for providing forward error correction to a plurality of devices coupled with a source.

FIG. 7 is a block diagram illustrating an example of a methodology for dynamically adjusting the total amount of forward error correction provided for a data stream.

FIG. 8 is a block diagram illustrating an example of a methodology for dynamically adjusting the amount of forward error correction provided by individual forward error correction streams belonging to a set of forward error correction streams.

OVERVIEW OF EXAMPLE EMBODIMENTS

Figure 1:
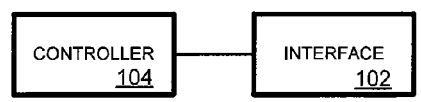
FIG. 1 is a block diagram illustrating an example of an apparatus for providing streaming data.

The following presents a simplified overview of the example embodiments in order to provide a basic understanding of some aspects of the example embodiments. This overview is not an extensive overview of the example embodiments. It is intended to neither identify key or critical elements of the example embodiments nor delineate the scope of the appended claims. Its sole purpose is to present some concepts of the example embodiments in a simplified form as a prelude to the more detailed description that is presented later.

In accordance with an example embodiment, there is disclosed herein an apparatus comprising an interface configured to communicate with a plurality of devices, and control logic coupled with the interface. The control logic advertises availability of a data stream and a plurality of forward error correction streams associated with the data stream via the interface. The control logic receives data representative of associated forward error correction streams for each of the plurality of devices requesting the data stream via the interface. The control logic selectively limits forwarding of the associated forward error connection streams via the interface to requested forward error correction streams.

In accordance with an example embodiment, there is disclosed herein a method comprising advertising the availability of a multicast video stream and a plurality of forward error correction streams associated with the multicast video stream. Data representative of forward error correction for each of a plurality of devices requesting the data stream is obtained. A minimum number of forward error correction streams that provide sufficient forward error correction to each of the plurality of devices requesting the stream is determined. The multicast video stream and the minimum number of forward error correction streams are selectively provided to the plurality of devices requesting the multicast video stream.

In accordance with an example embodiment, there is disclosed herein logic encoded in at least one non-transitory computer readable media for execution by a processor. The logic when executed by the processor is operable to advertise availability of a data stream and a plurality of forward error correction streams associated with the data stream. The logic when executed by a processor is further operable to obtain data representative forward error correction for each of a plurality of devices requesting the data stream and determine a minimum number of forward error correction streams that can be provided to the plurality of devices while providing sufficient forward error correction data for each of the plurality of devices requesting the stream. The logic when executed selectively provides the minimum number of forward error correction streams.

Description of Example Embodiments

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

In an example embodiment a venue provides one or more UDP/IP (User Datagram Protocol/Internet Protocol) video streams that are multicast over a network, with a last-hop distribution over a wireless media such as a WiFi network to mobile devices. Any suitable encoding may be employed. For example a Video Coding Experts Group (VCEG) H.264 compatible encoder is one example of a suitable encoder.

To compensate for lost packets over the WiFi multicast link, Forward Error Correction (FEC) data packets are generated from an associated set of source packets and then sent along with the original source stream packets. These FEC packets are added by the application at the transport layer, for example as a robustness complement to UDP, such as in the distribution head-end, before the video is distributed across a potentially lossy network. Alternatively, repair packets could be added at the link layer, also referred to as layer 2, for example as a complement to the WiFi link layer 2. The use of this type of Application-Layer FEC at the transport layer provides end-to-end communications robustness, whereas FEC at the link layer provides communications robustness over a specific communications link. In an example embodiment, the FEC mechanism provides erasure protection, such as for example is available from Reed Solomon and Raptor.

The source stream and FEC repair stream received by clients may be sent to the same multicast address with different ports used to differentiate between the two stream types. Alternatively, the source and FEC repair streams may be sent on different multicast addresses.

The number of FEC packets needed for reliability depends on the Packet Loss Rate (PLR) and loss burst sizes experienced by clients. Since the transmission of FEC repair data reduces the capacity available to deliver other data, in an example embodiment, ideally just enough FEC packets are sent to compensate for the lost packets. Since each client has a different Radio Frequency (RF) link, each client will probably experience a different PLR and loss burst sizes. Therefore, some clients will need more FEC, while other clients will need less FEC based on their individual link.

To optimize the Radio Frequency bandwidth needed for FEC repair data in the face of the packet loss variability, the video stream can be advertised as a base stream, with 1 or more (for example 2-4) FEC repair streams. Any suitable advertisement mechanisms may be employed, such as Session Announcement Protocol (SAP). The base stream and each FEC repair stream may have a different multicast address, which is part of the advertisement. For the case of multiple FEC repair streams, each FEC stream can be sent on a different multicast address.

For example, a first repair stream, Repair stream 1, has a certain amount of repair packets (e.g., 10% of the base stream) while a second repair stream, Repair stream 2, has an additional amount of repair packets (e.g., another 10%). The percentages for each repair stream are also advertised. Each client subscribes to the minimum number of repair streams it needs to repair all source packet erasures for its link conditions. From the preceding example, if the client needs 20% FEC to recover packet erasure, it would subscribe to both repair streams 1 and 2. For IP multicast, the client can employ IGMP (Internet Group Management Protocol) for subscribing the repair streams.

Some WLAN (Wireless Local Area Network) systems use IGMP snooping, so that the an Access Point (AP) only sends multicast streams while one or more clients on the AP are subscribed to the stream. By employing this feature, only repair streams needed by clients associated with an AP are sent by the AP. By sending the minimum number of FEC streams over the air, the overall wireless capacity of the system is increased and the co-channel interference is decreased. A further enhancement is for the AP to discard a specified and configurable percentage of repair packets, such that each AP transmits the minimum number of FEC packets to meet a specific service level for the clients in its coverage area. The percentage amount of FEC packets to discard could be modified over time to compensate for dynamic environment conditions.

Total FEC for all Repair Streams:

In an example embodiment, the total amount of available FEC (which is the sum of all repair streams) is fixed (or administratively configured). For example, the total amount of FEC might be set to 40% of the original source stream. In another implementation, the clients report statistics back to a central server on PLR and block losses. The server then dynamically adjusts the total amount of FEC to accommodate for the worst client conditions. A max cut-off could be set to guard against a few clients with very poor performance driving the system. For example, the max cut-off can be set to 50% FEC.

Amount of FEC for Each Repair Stream:

In an example embodiment, the amount of FEC in each repair stream could be fixed by dividing the total FEC rate by the number of repair streams. For example, if the total FEC is 40% and there are 4 repair streams, each repair stream would contain 10% FEC data. In an example embodiment, clients would report individual PLR and burst loss. The system would then adjust the amount of FEC in each repair stream such that an equal number of clients end up in each histogram bucket for number of streams required. For example, if there are four repair streams, then the amount of FEC in each stream would be chosen such that in the client distribution, 25% of clients will work with the first repair stream (repair stream 1), 50% will work with the first and second repair streams (repair stream 1+repair stream 2), 75% with three repair streams (e.g., repair streams 1+2+3), and 100% will work with all four repair streams. In this way, clients are evenly spread among the cases to maximize impact/value of each additional repair stream.

As a variant of the above approach, in addition to reporting PLR and burst loss, the clients would report which AP they were associated with. The even distribution could then be done at the AP level, rather than the individual client level (at the AP level, the worst client on the AP, determines the number of streams that must be sent over the air "OTA"). The amounts of FEC in each repair stream can be adjusted such that an equal number of APs are distributed in each histogram bucket. From the preceding example above, 100% of APs would end up sending a first repair stream, 75% of APs would send the first and second repair streams, 50% of APs would send the first, second, and third repair streams, and 25% would send all four repair streams.

In a particular embodiment, clients would report PLR, burst loss and which AP they are currently associated with. But rather than applying a simple histogram approach for setting the amount of FEC in each repair stream, a computed function for overall OTA traffic utilization (for FEC) would be globally optimized. A more detailed description of the method is described herein infra. The set of values for individual repair streams is constrained such that the total of the values is the total FEC required.

In other words:

Rate-n=FEC rate of repair stream N; and

Sum (Rate-n)=Total FEC desired

A search of the set of possible values using a cost function is performed. The cost function essentially computes the total OTA traffic which results from that selection of individual repair stream values. To compute the cost function, the client stats for each AP are obtained, and a determination is made for how many repair streams should be provided for each individual AP, given the current set of values and based on the worst client for the AP. The cost for that AP is the sum of Rate-n for the number of streams provided. The sum of costs for all APs is the total system cost.

A number of known search algorithms could be used. For example an exhaustive search may be performed if not computationally too expensive, or alternatively, a gradient search algorithm can be employed.

Stream Bundling:

A method used to increase FEC repair stream effectiveness is to apply an FEC repair stream to a group of 2 or more source streams, typically referred to as stream bundling. Protecting 2 or more streams with a common FEC stream improves the likelihood that the lost packets can be recovered when compared to protecting each stream with its own FEC repair stream. With bundling, a client receives the source and repair stream bundles, recovers source packet erasures and then discards all but the video stream(s) requested by the user. The principles described herein work equally well with bundled streams. The repair packets for the bundle are split out over two or more repair multicast addresses as described supra.

Sticky Clients:

Because the amount of multicast FEC data that is sent on an AP depends on the worst client on that AP, one consideration is to make sure that clients are associated with the best possible AP. In most current WiFi implementations, the decision of which AP to choose when many are visible (for example in a stadium environment) is under the control of the client. Clients can be "sticky", meaning once they are operating on an AP, they don't look to roam to another AP until the client is unable to communicate with its current AP, even if the client is moving around in the environment (for example a fan getting up from his seat to buy a hotdog) and could be better served by another AP.

To compensate the infrastructure can first detect when sticky clients exist. This can be done by measuring the signal strength of uplink packets from the client (either probes or other packets), and comparing the signal strength as seen by various APs in the area. When the strength of the signal observed from one of the surrounding APs is higher than the AP to which the client is associated, a determination is made that a sticky client exists. To remedy, the sticky client is disassociated from its current AP. When the client now probes for a new AP, only the AP which previously received the highest signal strength responds to the client probe. Alternatively, at disassociation time, the infrastructure can explicitly provide the client with information on the AP to which it should reassociate, for example using a means similar to the technique described in the proposed (Institute of Electrical and Electronics Engineers) IEEE 802.11v standard. Alternatively, software on the client may detect when the packet loss behavior of the multicast stream deteriorates and consequently force the client to probe for a better AP.

Weak Client Stuffing:

In an example embodiment, a client may operate in an edge of a coverage area, where the signal from all APs is weak. In this case, the client will require a maximum amount of multicast FEC data to compensate for the weak link. If a second client operates in this same area, it may choose a different AP from the set of weak signals. Since the amount of multicast FEC data that is sent on an AP depends on the worst client on that AP, it is beneficial from a system capacity standpoint to make sure both weak clients associate with the same AP. This can be referred to as weak client stuffing, where weak clients are put (or "stuffed") on the same AP when possible.

In an example embodiment, weak client detection is performed by measuring the signal strength of uplink packets from the client (either probes or other packets) and comparing the signal strength as seen by various APs in the area. When the signal strength observed by *all* APs is weak, then a determination is made that a weak client exists. A search is made for other weak clients on the same or neighboring APs. If the other weak clients are found spread among different APs, certain clients can be disassociated from their current APs and they can be steered to a common AP, using one of the techniques described herein supra for moving a sticky client from one AP to another AP (for example by control of probe responses or explicit request using an 802.11v compatible mechanism).

FIG. 1 is a block diagram illustrating an example of an apparatus 100 for providing streaming data. The streaming data may suitably be any type of data stream such as a video stream, audio stream, other type of data (e.g. a stock ticker or in the case of a sporting venue updated scores) or any combination of the aforementioned streams. Apparatus 100 comprises an interface 102 that is configured to communicate with a plurality of devices. The devices may be endpoints such as wireless clients (not shown, see e.g., FIG. 2) and/or other devices disposed on a network such as switches, routers and Access Points (APs) (not shown, see e.g., FIG. 2). A controller 104 is coupled with interface 102 and can send and/or receive data from external devices via interface 102. Controller 104 suitably comprises control logic for performing the functionality described herein. "Logic", as used herein, includes but is not limited to hardware, firmware, software and/or combinations of each to perform a function(s) or an action(s), and/or to cause a function or action from another component. For example, based on a desired application or need, logic may include a software controlled microprocessor, discrete logic such as an application specific integrated circuit (ASIC), a programmable/programmed logic device, memory device containing instructions, or the like, or combinational logic embodied in hardware. Logic may also be fully embodied as software stored on a non-transitory, tangible medium which performs a described function when executed by a processor. Logic may suitably comprise one or more modules configured to perform one or more functions.

Figure 2:
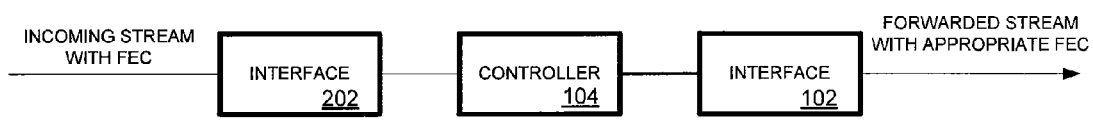
FIG. 2 is a block diagram illustrating an example of an apparatus that receives a data stream with associated forward error correction data and forwards the data stream with an appropriate amount of forward error correction.

Referring to FIG. 2 with continued reference to FIG. 1, there is illustrated an apparatus 200 comprising an interface 102, controller 104, and a second interface 202. Wherein 100 apparatus may be suitable for a device that provides the stream, apparatus 200 could be employed to implement a device that is between the source of a stream and the destination. For example, apparatus 200 may be employed to implement an access point or switch. In the illustrated example, apparatus 200 receives an incoming stream with FEC. Control logic in controller 104 determines how much of the FEC received at interface 202 should be forwarded via interface 102. In an example embodiment, controller 104 determines a minimum (appropriate) amount of FEC to forward via interface 102 that will satisfy the requirements of the plurality of devices in communication with interface 102. The device forwards the appropriate amount of FEC via interface 102 and discards any remaining FEC data.

In an example embodiment, controller 104 advertises the availability of a data stream and a plurality of forward error correction streams associated with the data stream via interface 102. The controller 104 receives data representative of forward error correction for each of the plurality of devices requesting the data stream via interface 102. In an example embodiment, the data representative of forward error correction may be requested by the devices. In another example embodiment, the devices may request an amount of forward error correction (FEC) and controller 104 determines which streams to provide to the device. Controller 104 selectively limits forwarding of the associated forward error connection streams via interface 102 to requested forward error correction streams. For example, if controller 104 is providing four FEC streams and the device with the highest FEC only requires three of the streams, then only the three streams are provided via interface 102. The fourth stream is not transmitted. If, for example, the device or devices receiving three FEC streams roam to another access point (AP), the controller determines the minimum amount of FEC for the remaining devices (for example 1 or 2 streams) and selectively provides the streams to provide the new minimum amount of FEC.

In an example embodiment, the data stream and the plurality of forward error correction streams have a same multicast address but have different port addresses. The advertisement may suitably comprise data representative of the multicast address and the appropriate port addresses of the FEC streams.

In another example embodiment, the data stream and the plurality of forward error correction streams have different multicast addresses. The advertisement suitably comprises data representative of the multicast addresses of the FEC streams.

In an example embodiment, controller 104 determines the amount of forward error correction for each of the plurality of devices from subscription requests for streams belonging to the plurality of forward error correction streams received from each of the plurality of devices via the interface. For example, while requesting the data stream, a device may also request FEC streams. The request may include the multicast, and in particular embodiments the port, of the FEC streams. In an example embodiment, controller 104 determines which streams each of the plurality of devices requested by snooping Internet Group Management Protocol (IGMP) packets received via interface 102.

In an example embodiment, controller 104 sets the total amount of forward error correction available from the plurality of forward error correction streams dynamically. For example, controller 104 may set the amount to the amount needed for the device needing the most FEC. Optionally, a maximum cut-off can be specified so that the amount of FEC does not exceed a certain amount, which would guard against a few clients with exceptionally poor performance driving the system. For example, the maximum amount of FEC can be capped at 50%.

In an example embodiment, a plurality of access points, each having at least one client requesting the data stream and at least one of the plurality of forward error correction streams are in data communication with interface 102. Controller 104 adjusts the amount of forward error correction in the plurality of forward error correction streams so that the plurality of forward error correction streams are evenly distributed among the plurality of access points.

Figure 3:
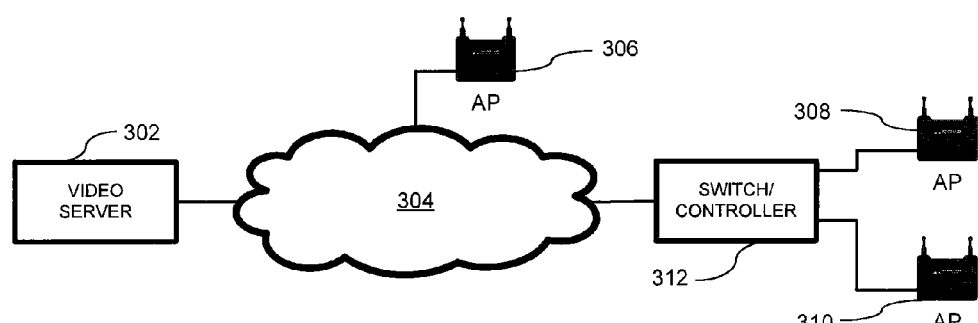
FIG. 3 is a block diagram illustrating an example of a network for providing streaming data.

For example, referring to FIG. 3 with continued reference to FIGS. 1 and 2, there is illustrated a network 300 comprising a video server 302, coupled via network 304 to AP 306 and switch controller 312, where switch controller 302 is coupled with APs 308, the functionality of controller 104 may be implemented by logic in any of video server 302 (which would be providing a video steam in this example), switch controller 312, and/or any of APs 306, 308, 310. For example, If 30% of FEC is being provided and control logic 104 is embodied in video server 302, amount of FEC for each stream (which is also referred to herein as "breakpoints") is divided among three APs 306, 308, 310, or one of APs 306, 308, 310 would receive 10% FEC, while a second of APs 306, 308, 310 would receive 20% FEC, and a third of APs 306, 308, 310 would receive 30% FEC; whereas controller 104 is embodied in switch/controller 312 the FEC would be distributed among two APs 308, 310 so for 30% FEC one of APs 308, 310 would provide 15% FEC and a second of APs 308, 310 would provide 30% FEC.

In an example embodiment, the amount of forward error correction available from each stream is determined by dividing a total number of forward error correction by a number of forward error correction streams being provided. For example, if the total amount of FEC being provided is 40% and four FEC repair streams are being provided, then each stream will have 10% FEC (40/10).

In an example embodiment, the amount of FEC available from each stream is determined by adjusting the amount of forward error correction in the plurality of forward error correction streams is evenly distributed among the plurality of devices. For example, referring to FIG. 4 with continued reference to FIG. 1, there is illustrated a network 400 with three basic service sets (or cells) 402, 404, 406 with six wireless clients (WC) 422, 424, 426, 442, 444, 464. In this example, control logic 104 would divide the total FEC so that the amount of FEC is divided among the clients. For example, if the total FEC is 30%, WC 422, 424 may receive 10% FEC, while WC 426, 442 receive 20% FEC, and WC 444, 464 receive 30% FEC.

In an example embodiment, wherein a plurality of access points, each having at least one client requesting the data stream and at least one of the plurality of forward error correction streams are in data communication with interface 102, controller 104 control logic adjusts the amount of forward error correction in the plurality of forward error correction streams to minimize an amount of forward error correction streams being provided by the plurality of access points. For example, again referring to FIG. 4 with continued reference to FIG. 1, if the worst case scenario for AP 412 is a client employing 15% FEC, while the worst case scenario for AP 414 is a client employing 20% and a worst case scenario for AP 416 is a client employing 35% FEC, the total FEC is set to 35% and the amount of FEC (breakpoints) of the FEC repair streams is adjusted so that AP 412 provides 15% FEC, AP 414 provides 20% FEC, and AP 416 provides 35% FEC.

In an example embodiment, where a plurality of access points, each having at least one client requesting the data stream and at least one of the plurality of forward error correction streams are in data communication with interface 102, controller 104 determines for each possible value of a set of possible values for each of the plurality of forward error correction streams an amount of resulting traffic for the set of possible values. The controller 104 selects a set of values from the set of possible values that minimizes a cost function such as the amount of resulting traffic. For example, if there are N repair streams, FEC values are selected for each stream n, such that the sum of streams n=N. A cost function is employed to determine the amount of bandwidth (or in the case of a wireless network the amount of the over the air "OTA" time) for each possible value of FEC. A search of the set of possible values using a cost function is performed. The cost function essentially computes the total OTA traffic which results from that selection of individual repair stream values. To compute the cost function, the client stats for each AP are obtained, and a determination is made for how many repair streams should be provided for each individual AP, given the current set of values and based on the worst client for the AP. The cost for that AP is the sum of Rate-n for the number of streams provided. The sum of costs for all APs is the total system cost.

A number of known search algorithms could be used. For example an exhaustive search may be performed if not computationally too expensive, or alternatively, a gradient search algorithm can be employed.

In an example embodiment, controller 104 may search for "sticky" clients. Because the amount of multicast FEC data that is sent on an AP depends on the worst client on that AP, one consideration is to make sure that clients are associated with the best possible AP. In WiFi implementations, the decision of which AP to choose when many are visible (for example in a stadium environment) is under the control of the client software. Clients can be "sticky", meaning once they are operating on an AP, they don't look for another AP until the signal is totally lost, even if the client is moving around in the environment (for example a fan getting up from his seat to buy a hotdog). Controller 104 may receive signal strength data from APs in communication with interface 102.

To compensate, controller 104 can detect when sticky clients exist. This can be done by measuring the signal strength of uplink packets from the client (either probes or other packets), and comparing the signal strength as seen by various APs in the area. When the strength of the signal observed from one of the surrounding APs is higher than the AP to which the client is associated, a determination is made that a sticky client exists. To remedy, the sticky client is disassociated from its current AP. When the client now probes for a new AP, only the AP which previously saw the client with highest signal strength responds to the probe. Alternatively, at disassociation time, the infrastructure can explicitly provide the client with information on the AP to which it should reassociate, for example using a means similar to the technique described in the proposed IEEE 802.11v standard. Alternatively, software on the client may detect when the packet loss behavior of the multicast stream deteriorates and consequently force the client to probe for a better AP.

For example, referring again to FIG. 4 with continued reference to FIGS. 1 and 2, assume WC 444 is associated with AP 416. WC 444 is actually closer to AP 414 than it is to AP 416; therefore a communication link between WC 444 and AP 414 may be better than the present link between WC 444 and AP 416. If WC 444 is the worst client associated with AP 416, that is it employs the most FEC, AP 416 may be directed to disassociate with WC 444 forcing WC 444 to roam. Since WC 444 is near AP 414, it would associate with AP 414. In particular embodiments, WC 444 may be forced to roam even if it's not the worst performing client associated with AP 416, providing a better connection exists with AP 414.

In an example embodiment, where a plurality of access points are in data communication with interface 102, controller 104 may select one access point from the plurality of access points to provide the data stream to weak clients (even if there are presently no clients associated with the selected access point). Controller 104 detects at least one weak client (a client employing an amount of FEC that is greater than a predefined amount) is associated with either selected access point or an access point neighboring the selected access point. Controller 104 directs the at least one weak client to roam to the selected access point.

For example, referring again to FIG. 4 with continued reference to FIGS. 1 and 2, assume WC 424 and 426 are both near the edge of cell 402 and are the weakest clients associated with AP 412, and WC 444 is the weakest client associated with AP 416. Controller 104 may select AP 414, which can communicate with WCs 424, 426, 444 to service weak clients. Thus, WCs 424, 426, 424 can be directed to roam to AP 414. Accordingly, this should reduce the maximum amount of FEC that APs 412 and 416 provide.

Figure 4:
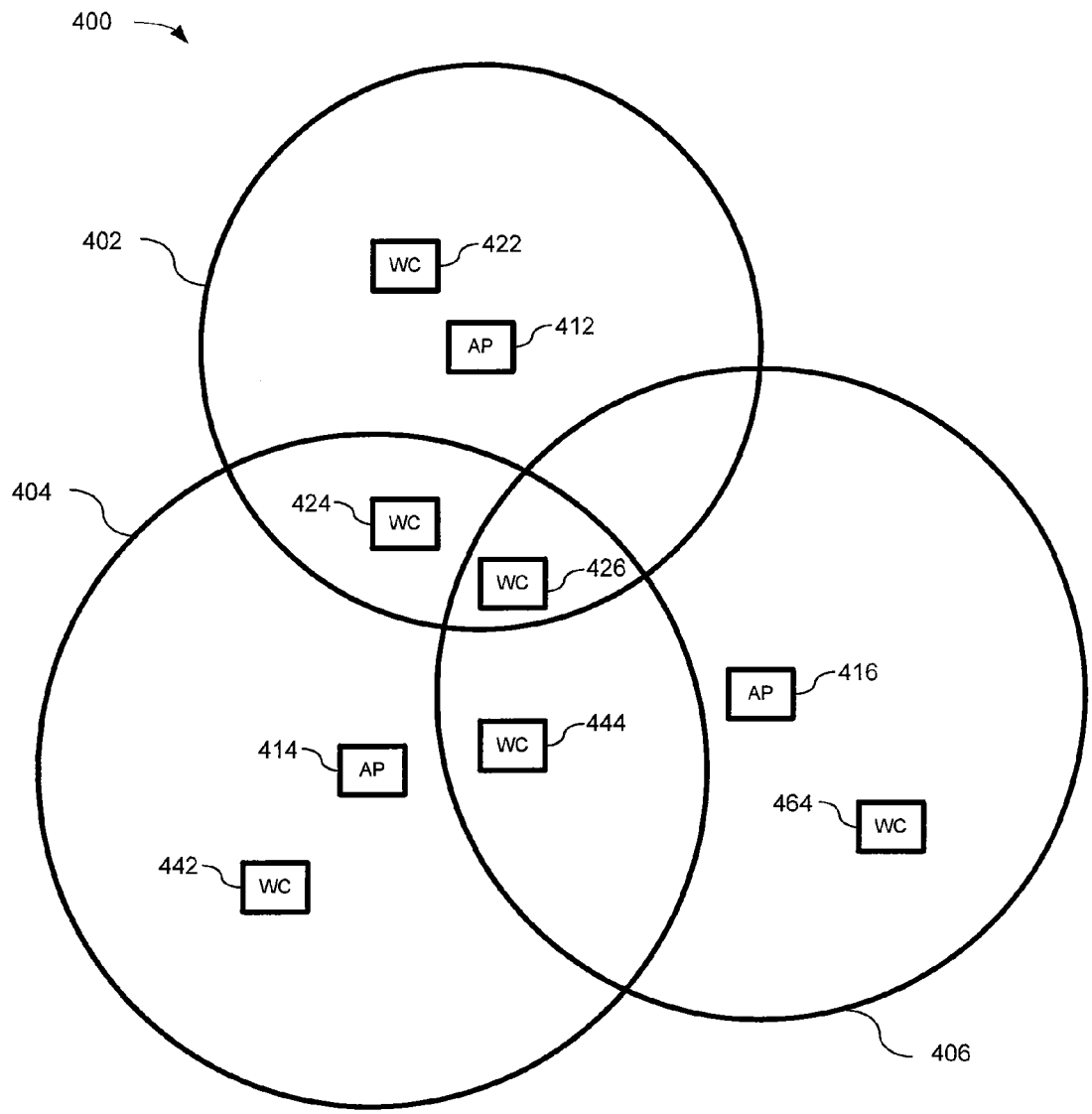
FIG. 4 is a block diagram illustrating an example of a wireless network with overlapping coverage areas.
Figure 5:
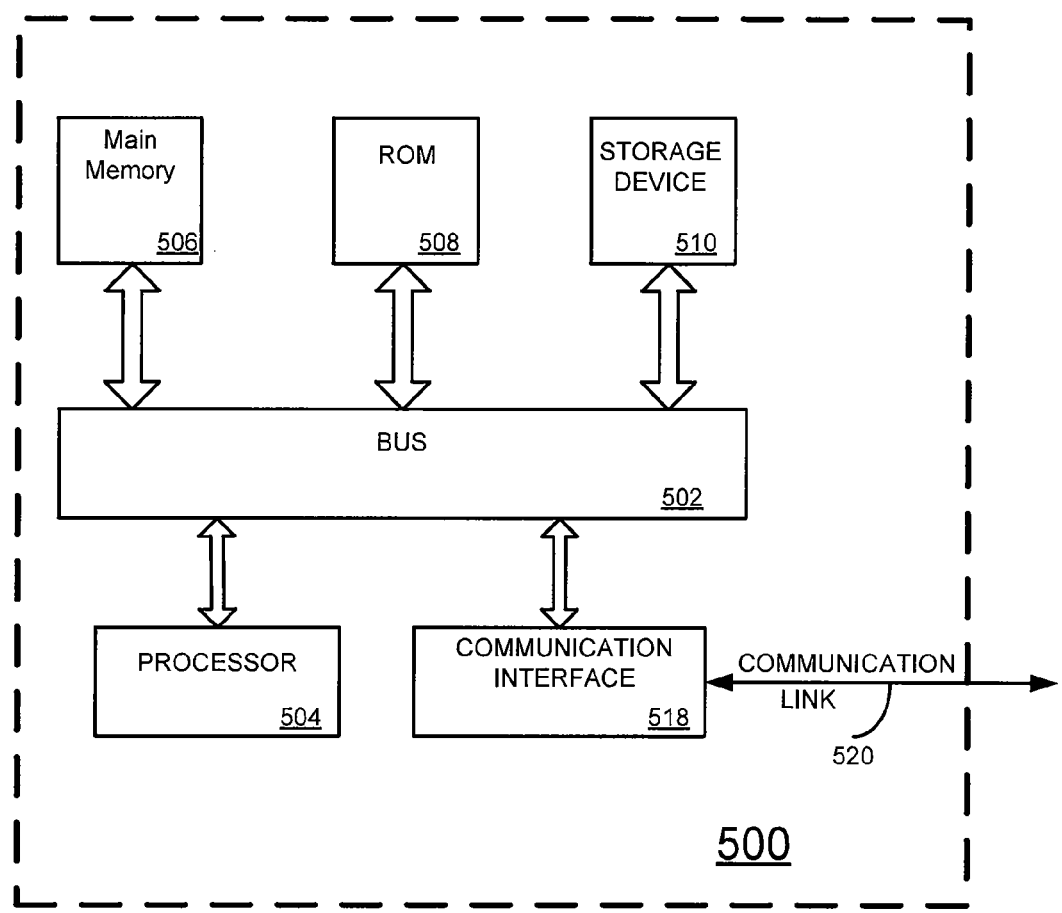
FIG. 5 is a block diagram illustrating an example of a computer system upon which an example embodiment may be implemented.

FIG. 5 is a block diagram illustrating an example of a computer system 500 upon which an example embodiment may be implemented. Computer system 500 is suitable for implementing the functionality described herein for any of controller 104 (FIG. 1 & FIG. 2) video server 302 (FIG. 3), APs 306, 308, 310 (FIG. 3), and/or APs 412, 414, 416 (FIG. 4).

Computer system 500 includes a bus 502 or other communication mechanism for communicating information and a processor 504 coupled with bus 502 for information. Computer system 500 also includes a main memory 506, such as random access memory (RAM) or other dynamic storage device coupled to bus 502 for storing information and instructions to be executed by processor 504. Main memory 506 also may be used for storing a temporary variable or other intermediate information during execution of instructions to be executed by processor 504. Computer system 500 further includes a read only memory (ROM) 508 or other static storage device coupled to bus 502 for storing static information and instructions for processor 504. A storage device 510, such as a magnetic disk or optical disk, is provided and coupled to bus 502 for storing information and instructions.

An aspect of the example embodiment is related to the use of computer system 500 for providing capacity optimized streaming data with forward error correction. According to an example embodiment, providing capacity optimized streaming data with forward error correction is provided by computer system 500 in response to processor 504 executing one or more sequences of one or more instructions contained in main memory 506. Such instructions may be read into main memory 506 from another computer-readable medium, such as storage device 510. Execution of the sequence of instructions contained in main memory 506 causes processor 504 to perform the process steps described herein. One or more processors in a multi-processing arrangement may also be employed to execute the sequences of instructions contained in main memory 506. In alternative embodiments, hard-wired circuitry may be used in place of or in combination with software instructions to implement an example embodiment. Thus, embodiments described herein are not limited to any specific combination of hardware circuitry and software.

The term "computer-readable medium" as used herein refers to any medium that participates in providing instructions to processor 504 for execution. Such a medium may take many forms, including but not limited to non-volatile media, and volatile media. Non-volatile media include for example optical or magnetic disks, such as storage device 510. Volatile media include dynamic memory such as main memory 506. As used herein, tangible media may include volatile and non-volatile media. Common forms of computer-readable media include for example floppy disk, a flexible disk, hard disk, magnetic cards, paper tape, any other physical medium with patterns of holes, a RAM, a PROM, an EPROM, a FLASHPROM, CD, DVD or any other memory chip or cartridge, or any other medium from which a computer can read.

Computer system 500 also includes a communication interface 518 coupled to bus 502. Communication interface 518 provides a two-way data communication coupling computer system 500 to a communication link 520 that enables computer system 500 to obtain data from external devices. For example requests for streaming data and forward error correction streams may be received via communication link 520 by communication interface 518. Moreover, advertisements to external devices may be sent onto communication link 520 via communication interface 518.

For example, communication interface 518 may comprise a local area network (LAN) card to provide a data communication connection to a compatible LAN. As another example, communication interface 518 may be an integrated services digital network (ISDN) card or a modem to provide a data communication connection to a corresponding type of telephone line. Wireless links may also be implemented. In any such implementation, communication interface 518 sends and receives electrical, electromagnetic, or optical signals that carry digital data streams representing various types of information.

Computer system 500 can send messages and receive data, including program codes, through the network(s), network link 520, and communication interface 518. In the Internet example, a server 430 might transmit a requested code for an application program through Internet 528, ISP 526, local network 522, and communication interface 518. In accordance with an example embodiment, one such downloaded application provides for providing capacity optimized streaming data with forward error correction as described herein.

In view of the foregoing structural and functional features described above, methodologies in accordance with example embodiments will be better appreciated with reference to FIGS. 6-8. While, for purposes of simplicity of explanation, the methodologies of FIGS. 6-8 are shown and described as executing serially, it is to be and appreciated that the example embodiments are not limited by the illustrated order, as some aspects could occur in different orders and/or concurrently with other aspects from that shown and described herein. Moreover, not all illustrated features may be required to implement the methodologies described herein. The methodologies described herein are suitably adapted to be implemented in hardware, software, or a combination thereof such as for example a processor executing software.

FIG. 6 is a block diagram illustrating a methodology 600 for providing forward error correction to a plurality of devices coupled with a source stream. Methodology 600 may be implemented by controller 104 (FIG. 1 & FIG. 2) or by logic embodied in video server 302 (FIG. 3), APs 306, 308, 310 (FIG. 3), APs 412, 414, 416 (FIG. 4), and/or processor 504 (FIG. 5).

At 602, an advertisement is transmitted that advertises the availability of a data stream and associated forward error correction streams. The advertisements may be sent using any suitable protocol. For example, in an example embodiment, the advertisements may be provided in a SAP announcement.

At 604, data representative forward error correction for each of a plurality of devices requesting the data stream is obtained. The data may be received via subscription requests (e.g., the devices may subscribe to the data stream and subscribe to FEC streams) or other ways. For example, each device may indicate how much FEC it desires and the appropriate FEC streams are determined. In an example embodiment, a requested amount of FEC is obtained by snooping IGMP requests for FEC repair streams.

At 606, a minimal amount of FEC that can provide sufficient FEC to all of the devices is determined. The minimal amount of FEC is the amount that can be provided that is sufficient for the worst case scenario. For example, if four streams are available and if one device requires a first stream and a second device requires the first, second, and third stream, then the minimal amount of FEC would be the first, second, and third FEC repair streams. In an example embodiment, as described herein, the maximum provided FEC and/or breakpoints of the FEC streams can be adjusted. For example, the FEC can be adjusted to accommodate the worst client conditions. As another example, the breakpoints can be adjusted either to even amounts (e.g., linearly such as for four streams each stream adds 25% FEC), or dynamically adjusted to distribute FEC streams evenly among clients and/or APs. In an example embodiment, the total amount of FEC and/or the breakpoints are dynamically adjusted in order to minimize the amount of data being sent to the plurality of devices.

At 608, the minimum effective amount of FEC for processing the stream by all devices is selectively provided. This amount may change due to changes in environment and/or roaming or disassociation of devices.

FIG. 7 is a block diagram illustrating an example of a methodology 600 for dynamically adjusting the total amount of forward error correction provided for a data stream. Methodology 700 may be implemented by controller 104 (FIG. 1 & FIG. 2) or by logic embodied in video server 302 (FIG. 3), APs 306, 308, 310 (FIG. 3), APs 412, 414, 416 (FIG. 4), and/or processor 504 (FIG. 5).

At 702, data representative forward error correction for each of a plurality of devices requesting the data stream is obtained. The data may be received via subscription requests (e.g., the devices may subscribe to the data stream and subscribe to FEC streams) or other ways. For example, each device may indicate how much FEC it desires and the appropriate FEC streams are determined. In an example embodiment, a requested amount of FEC is obtained by snooping IGMP requests for FEC repair streams.

At 704, the worst case scenario is determined. The worst case scenario corresponds to the maximum amount of FEC for any member of the plurality of devices. For example, if a first device employs 10% FEC and a second device employs 35% FEC, the maximum amount of FEC is 35%.

Optionally, at 706, a determination is made whether the maximum amount of FEC exceeds a predefined maximum. For example, the maximum amount of available FEC may be limited to guard against a small amount of devices belonging to the plurality of devices with exceedingly poor signal quality from driving the amount of FEC provided. If, at 706, the amount of FEC exceeds the MAX (YES), at 708, the total amount of available FEC is set to the predefined maximum amount. If, however, at 706, the total amount of FEC is less than the predefined maximum (NO), or if there is no preset maximum amount, at 710 the total amount of FEC is set to the worst case scenario.

FIG. 8 is a block diagram illustrating an example of a methodology 700 for dynamically adjusting the amount of forward error correction provided by individual forward error correction streams belonging to a set of forward error correction streams. Methodology 800 may be implemented by controller 104 (FIG. 1 & FIG. 2) or by logic embodied in video server 302 (FIG. 3), APs 306, 308, 310 (FIG. 3), APs 412, 414, 416 (FIG. 4), and/or processor 504 (FIG. 5).

At 802, data representative forward error correction for each of a plurality of devices requesting the data stream is obtained. The data may be received via subscription requests (e.g., the devices may subscribe to the data stream and subscribe to FEC streams) or other ways. For example, each device may indicate how much FEC it desires and the appropriate FEC streams are determined. In an example embodiment, a requested amount of FEC is obtained by snooping IGMP requests for FEC repair streams.

At 804, the FEC streams are adjusted. In an example embodiment, the total FEC (or SUM) for all repair streams is adjusted. For example, the total amount of available FEC if, at 802, the clients report statistics back to a central server on PLR and block losses. The server can dynamically adjust the total amount of FEC to accommodate for the worst client conditions. A max cut-off could be set to guard against a few clients with very poor performance driving the system. For example, the max cut-off can be set to 50% FEC.

In an example embodiment, the amount of FEC for each repair stream is adjusted. In an example embodiment, the amount of FEC in each repair stream could be fixed by dividing the total FEC rate by the number of repair streams. For example, if the total FEC is 40% and there are 4 repair streams, each repair stream would contain 10% FEC data. The amount of FEC in each stream would change as the total FEC changes. In an example embodiment, clients would report individual PLR and burst loss. The system adjusts the amount of FEC in each repair stream such that an equal number of clients end up in each histogram bucket for number of streams required. For example, if there are four repair streams, then the amount of FEC in each stream would be chosen such that in the client distribution, 25% of clients will work with the first repair stream (repair stream 1), 50% will work with the first and second repair streams (repair stream 1+repair stream 2), 75% with three repair streams (e.g., repair streams 1+2+3), and 100% will work with all four repair streams. In this way, clients are evenly spread among the cases to maximize impact/value of each additional repair stream.

In an example embodiment, in addition to reporting PLR and burst loss, the clients would report which AP they were associated with. The even distribution could then be done at the AP level, rather than the individual client level (at the AP level, the worst client on the AP, determines the number of streams that must be sent over the air "OTA"). The amounts of FEC in each repair stream can be adjusted such that an equal number of APs are distributed in each histogram bucket. From the preceding example above, 100% of APs would end up send a first repair stream, 75% of APs would send the first and second repair streams, 50% of APs would send the first, second, and third repair streams, and 25% would send all four repair streams.

In a particular embodiment, clients would report PLR, burst loss and which AP they are currently associated with. But rather than applying a simple histogram approach for setting the amount of FEC in each repair stream, a computed function for overall OTA traffic utilization (for FEC) would be globally optimized. A more detailed description of the method is described herein infra. The set of values for individual repair streams can be constrained such that the total of the values is the total FEC required.

In other words:

Rate-n=FEC rate of repair stream N; and

Sum (Rate-n)=Total FEC desired

A search of the set of possible values using a cost function is performed. The cost function essentially computes the total OTA traffic which results from that selection of individual repair stream values. To compute the cost function, the client stats for each AP are obtained, and a determination is made for how many repair streams should be provided for each individual AP, given the current set of values and based on the worst client for the AP. The cost for that AP is the sum of Rate-n for the number of streams provided. The sum of costs for all APs is the total system cost.

A number of known search algorithms could be used. For example an exhaustive search may be performed if not computationally too expensive, or alternatively, a gradient search algorithm can be employed.

Although the description herein is directed to a multicast video stream over a wireless media, those skilled in the art should readily appreciate that the example embodiments described herein were merely selected for ease of illustration and that the principles described herein are suitably adaptable to other operating environments. For example the principles described herein are adaptable to wired environments and may also be employed in environments were a unicast stream is being provided to multiple recipients. Therefore, the principles described herein should not be construed as limited to the illustrated example embodiments.

Described above are example embodiments. It is, of course, not possible to describe every conceivable combination of components or methodologies, but one of ordinary skill in the art will recognize that many further combinations and permutations of the example embodiments are possible. Accordingly, this application is intended to embrace all such alterations, modifications and variations that fall within the spirit and scope of the appended claims interpreted in accordance with the breadth to which they are fairly, legally and equitably entitled.

The invention claimed is:

1. An apparatus, comprising:
an interface configured to communicate with a plurality of devices;
control logic coupled with the interface;
wherein the control logic receives a data stream and a plurality of forward error correction streams associated with the data stream via the interface;
wherein the control logic receives data representative of forward error correction for each of the plurality of devices requesting the data stream via the interface; and
wherein the control logic selectively limits forwarding of the associated forward error connection streams via the interface to a minimal amount of forward error correction streams that enables all of the plurality of devices to process the data stream.

2. The apparatus of claim 1, wherein the data stream is a multicast stream.

3. The apparatus of claim 1, wherein the data stream is a multicast video stream.

4. The apparatus of claim 1, wherein the control logic determines the amount of forward error correction for each of the plurality of devices from subscription requests for streams belonging to the plurality of forward error correction streams received from each of the plurality of devices via the interface.

5. The apparatus of claim 1, wherein a total amount of forward error correction forwarded to the plurality of devices is dynamically set.

6. The apparatus of claim 1, wherein the amount of forward error correction forwarded to the plurality of devices is adjusted so that the plurality of forward error correction streams are evenly distributed among the plurality of devices.

7. The apparatus of claim 1, wherein the control logic discards a specified and configurable percentage of forward error correction repair packets such that a minimum number of forward error correction repair packets are forwarded via the interface to meet a specific service level for all of the plurality of devices.

8. The apparatus of claim 7, wherein the specified and configurable percentage of forward error correction repair packets is modified over time to compensate for dynamic environment conditions.

9. A method, comprising:
receiving a multicast video stream and a plurality of forward error correction streams associated with the multicast video stream;
obtaining data representative forward error correction for each of a plurality of devices requesting the data stream;
determining, by a processor, from the data representative of forward error correction a minimum number of forward error correction streams that can be forwarded to the plurality of devices while providing sufficient forward error correction to each of the plurality of devices requesting the multicast video stream; and
selectively forwarding the multicast video stream and the minimum number of forward error correction streams.

10. The method of claim 9, wherein determining the minimum number of forward error correction streams further comprises obtaining the amount of forward error correction for each of the plurality of devices from subscription requests for streams belonging to the plurality of forward error correction streams received from each of the plurality of devices.

11. The method of claim 9, wherein a total amount of forward error correction forwarded to the plurality of devices is dynamically set.

12. The method of claim 9, wherein the amount of forward error correction forwarded to the plurality of devices is adjusted so that the plurality of forward error correction streams are evenly distributed among the plurality of devices.

13. The method of claim 9, further comprising discarding a specified and configurable percentage of forward error correction repair packets such that a minimum number of forward error correction repair packets are forwarded to meet a specific service level for all of the plurality of devices.

14. The method of claim 13, wherein the specified and configurable percentage of forward error correction repair packets is modified over time to compensate for dynamic environment conditions.

15. Logic encoded in at least one non-transitory computer readable media for execution by a processor and when executed by the processor operable to:
    receive a data stream and a plurality of forward error correction streams associated with the data stream;
    obtain data representative forward error correction for each of a plurality of devices requesting the data stream;
    determine a minimum number of forward error correction streams that can be forwarded to the plurality of devices while providing sufficient forward error correction data for each of the plurality of devices requesting the stream; and
    selectively forward the minimum number of forward error correction streams.

16. The logic of claim 15, wherein the logic is further operable to obtain the amount of forward error correction for each of the plurality of devices from subscription requests for streams belonging to the plurality of forward error correction streams received from each of the plurality of device in order to determine the minimum number of forward error correction streams.

17. The logic of claim 15, wherein the logic is operable to dynamically set a total amount of forward error correction forwarded to the plurality of devices.

18. The logic of claim 15, wherein the logic is further operable to adjust the amount of forward error correction forwarded to the plurality of devices so that the plurality of forward error correction streams are evenly distributed among the plurality of devices.

19. The logic of claim 15, wherein the logic is further operable to discard a specified and configurable percentage of forward error correction repair packets such that a minimum number of forward error correction repair packets are forwarded to meet a specific service level for all of the plurality of devices.

20. The logic of claim 19, wherein the logic is operable to modify the specified and configurable percentage of forward error correction repair packets over time to compensate for dynamic environment conditions.

* * * * *